US011966837B2

(12) United States Patent
Phan et al.

(10) Patent No.: US 11,966,837 B2
(45) Date of Patent: Apr. 23, 2024

(54) COMPRESSION OF DEEP NEURAL NETWORKS

(71) Applicant: International Business Machines Corporation, Armonk, NY (US)

(72) Inventors: Dzung Phan, Ossining, NY (US); Lam Nguyen, Ossining, NY (US); Nam H. Nguyen, Pleasantville, NY (US); Jayant R. Kalagnanam, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1353 days.

(21) Appl. No.: 16/351,712

(22) Filed: Mar. 13, 2019

(65) Prior Publication Data

US 2020/0293876 A1    Sep. 17, 2020

(51) Int. Cl.
*G06N 3/08*     (2023.01)
*G06N 3/047*    (2023.01)
*H03M 7/30*     (2006.01)

(52) U.S. Cl.
CPC ............... *G06N 3/08* (2013.01); *G06N 3/047* (2023.01); *H03M 7/702* (2013.01)

(58) Field of Classification Search
CPC ........ G06N 3/08; G06N 3/0472; H03M 7/702
See application file for complete search history.

(56) References Cited

U.S. PATENT DOCUMENTS

| 8,700,552 B2 | 4/2014 | Yu |
| 2016/0293167 A1 | 10/2016 | Chen |
| 2016/0321541 A1 | 11/2016 | Liu |
| 2018/0046895 A1 | 2/2018 | Xie |
| 2018/0046914 A1* | 2/2018 | Li .......................... G06N 3/082 |
| 2018/0075347 A1* | 3/2018 | Alistarh ................. G06N 3/084 |
| 2018/0089564 A1* | 3/2018 | Tate ....................... G06N 3/045 |
| 2018/0204110 A1* | 7/2018 | Kim ........................ G06N 3/04 |
| 2019/0205649 A1* | 7/2019 | Ananthanarayanan ..................... G06V 10/87 |
| 2019/0228284 A1* | 7/2019 | Holland ................. G06N 3/047 |
| 2019/0303750 A1* | 10/2019 | Kumar ................... G06F 7/5443 |
| 2019/0392300 A1* | 12/2019 | Weber ..................... G06N 3/04 |
| 2019/0392323 A1* | 12/2019 | Yan ........................ G06N 3/048 |
| 2020/0143249 A1* | 5/2020 | Georgiadis ............. G06N 3/045 |

(Continued)

FOREIGN PATENT DOCUMENTS

| WO | 2018053835 A1 | 3/2018 |
| WO | 2018058509 A1 | 4/2018 |

OTHER PUBLICATIONS

Carreira-Perpiñán ("Learning-Compression" Algorithms for Neural Net Pruning, Jun. 2018, pp. 8532-8541) (Year: 2018).*

(Continued)

*Primary Examiner* — George Giroux

(74) *Attorney, Agent, or Firm* — Stephanie L. Carusillo

(57) ABSTRACT

In an approach for compressing a neural network, a processor receives a neural network, wherein the neural network has been trained on a set of training data. A processor receives a compression ratio. A processor compresses the neural network based on the compression ratio using an optimization model to solve for sparse weights. A processor re-trains the compressed neural network with the sparse weights. A processor outputs the re-trained neural network.

14 Claims, 5 Drawing Sheets

(56) References Cited

U.S. PATENT DOCUMENTS

2020/0210838 A1* 7/2020 Lo .................. G06N 3/084

OTHER PUBLICATIONS

Louizos et al. (Learning Sparse Neural Networks Through L0 Regularization, Jun. 2018, pp. 1-13) (Year: 2018).*
Carreira-Perpiñán (Model compression as constrained optimization, with application to neural nets. Part I: general framework, Jul. 2017, pp. 1-23) (Year: 2017).*
Carreira-Perpiñán (Model compression as constrained optimization with application to neural nets. Part II: quantization, Jul. 2017, pp. 1-33) (Year: 2017).*
Phan et al. (A Novel I0-constrained Gaussian Graphical Model for Anomaly Localization, Nov. 2017, pp. 830-833) (Year: 2017).*
Xiang et al. (Learning Sparse Representations of High Dimensional Data on Large Scale Dictionaries, Dec. 2011, pp. 1-9) (Year: 2011).*
Tsuzuku et el. (Variance-based Gradient Compression for Efficient Distributed Deep Learning, Feb. 2018, pp. 1-12) (Year: 2018).*
Dong et al. (Learning to Prune Deep Neural Networks via Layer-wise Optimal Brain Surgeon, 2017, pp. 1-11) (Year: 2017).*
Alvarez, et al., "Learning the Number of Neurons in Deep Networks", In Advances in Neural Processing Systems, 9 pages, Oct. 11, 2018.
Collins, et al., "Memory Bounded Deep Convolutional Networks", 10 pages, Dec. 3, 2014.
Dong, et al., "Learning to Prune Deep Neural Networks via Layer-wise Optimal Brain Surgeon", In Advances in Neural Information Processing Systems, 2017, 11 pages.
Guo, et al, "Dynamic Network Surgery for Efficient DNNs", In Advances in Neural Information Processing Systems, 9 pages, Nov. 10, 2016.
Han et al., "Learning both Weights and Connections for Efficient Neural Networks", In Advances in Neural Information Processing Systems, 9 pages, Oct. 30, 2015.
Lecun, et al., "Gradient-Based Learning Applied to Document Recognition", Proc. of the IEEE, Nov. 1998, 46 pages.
Molchanov, et al., "Variational Dropout Sparsifies Deep Neural Networks", Proceedings of the International Conference on Machine Learning, 10 pages, Copyright 2017.
Murray, et al., "Auto-Sizing Neural Networks: With Applications to n-gram Language Models", Department of Computer Science and Engineering, University of Notre Dame, Aug. 20, 2015, 9 pages.
Scardapane, et al., "Group Sparse Regularization for Deep Neural Networks", IEEE, Jul. 2, 2016, 11 pages.
Yu, J., Lukefahr, A., Palframan, D. et al. (2017). Scalpel: Customizing DNN pruning to the underlying hardware parallelism. ACM SIGARCH Computer Architecture News, 45(2), pp. 548-560.
Zhang, et al., "Learning to Share: Simultaneous Parameter Tying and Sparsification in Deep Learning", Published as a conference paper in ICLR 2018, 14 pages.
Zhang, T., Ye, S., Zhang, K. et al. (2018). A systematic DNN weight pruning framework using alternating direction method of multipliers. arXiv preprint arXiv:1804.03294.
Zhou, et al., "Less is More: Towards Compact CNNs", 16 pages, In European Conference on Computer Vision, Springer 2016.

* cited by examiner

```
Algorithm  Variance-reduction stochastic gradient descent
Parameters: the learning rate η > 0, the number of outer iterations S,
and the inner loop size m.
Initialize: w̃₀
Iterate:
for s = 1, 2, ..., S do
    w₀ = w̃ₛ₋₁
    v₀ = ∇φ(w₀) = (1/n) Σⁿᵢ₌₁ ∇fᵢ(w₀)
    w₁ = Proj(w₀ − ηv₀)
    Iterate:
    for t = 1, ..., m − 1 do
        Sample iₜ uniformly at random from [n]
        vₜ = ∇fᵢₜ(wₜ) − ∇fᵢₜ(wₜ₋₁) + vₜ₋₁
        wₜ₊₁ = Proj(wₜ − ηvₜ)
    end for
    Set w̃ₛ = wₘ.
end for
```

FIG. 3

| Network | Method | Compression Rate |
|---|---|---|
| MNIST | | |
| LeNet-300-100 | Dense | 1 |
| | Han et al. (2015) | 12 |
| | Guo et al. (2016) | 56 |
| | Ullrich et al. (2017) | 23 |
| | Molchanov et al. (2017) | 68 |
| | Invention | 85 |
| LeNet-5 | Dense | 1 |
| | Han et al. (2015) | 12 |
| | Guo et al. (2016) | 111 |
| | Ullrich et al. (2017) | 200 |
| | Molchanov et al. (2017) | 280 |
| | Invention | 307 |
| CIFAR-10 | | |
| VGG-16 | Dense | 1 |
| | Molchanov et al. (2017) | 48 |
| | Invention | 52 |

FIG. 4

COMPRESSION OF DEEP NEURAL NETWORKS

BACKGROUND

The present invention relates generally to the field of neural networks, and more particularly to compressing a deep neural network.

A neural network is a computing system that is a framework for many different machine learning algorithms to work together and process complex data inputs. Neural networks use mathematical modeling to perform tasks without any task-specific programming. Neural networks are trained to perform these tasks by using example data sets. Neural networks can be used in a wide variety of applications including, but not limited to, function representation, pattern recognition, image classification, speech recognition, medical diagnosis, computer vision, machine translation, etc.

A neural network is based on a collection of connected units or nodes called neurons, which loosely model the neurons in a biological brain. Each connection can transmit a signal from one neuron to another that is processed and then transmitted to additional connected neurons. These neurons are aggregated into layers and different layers may perform different kinds of transformations on their inputs. Deep neural networks (DNNs) have many layers between the input and output layers. DNNs find the correct mathematical manipulation to turn the input into the output, whether it be a linear relationship or a non-linear relationship. Each mathematical manipulation is considered a layer, and with DNNs having many layers, DNNs can require large amounts of storage, large amounts of computing power, and long inference times.

SUMMARY

Aspects of an embodiment of the present invention disclose a method, computer program product, and computer system for compressing a neural network. A processor receives a neural network, wherein the neural network has been trained on a set of training data. A processor receives a compression ratio. A processor compresses the neural network based on the compression ratio using an optimization model to solve for sparse weights. A processor re-trains the compressed neural network with the sparse weights. A processor outputs the re-trained neural network.

BRIEF DESCRIPTION OF THE DRAWINGS

FIG. 3 depicts a chart of experimental results of a neural network compression program, in accordance with an embodiment of the present invention.

FIG. 4 depicts an algorithm used by neural network compression program, in accordance with an embodiment of the present invention.

DETAILED DESCRIPTION

Figure 1:
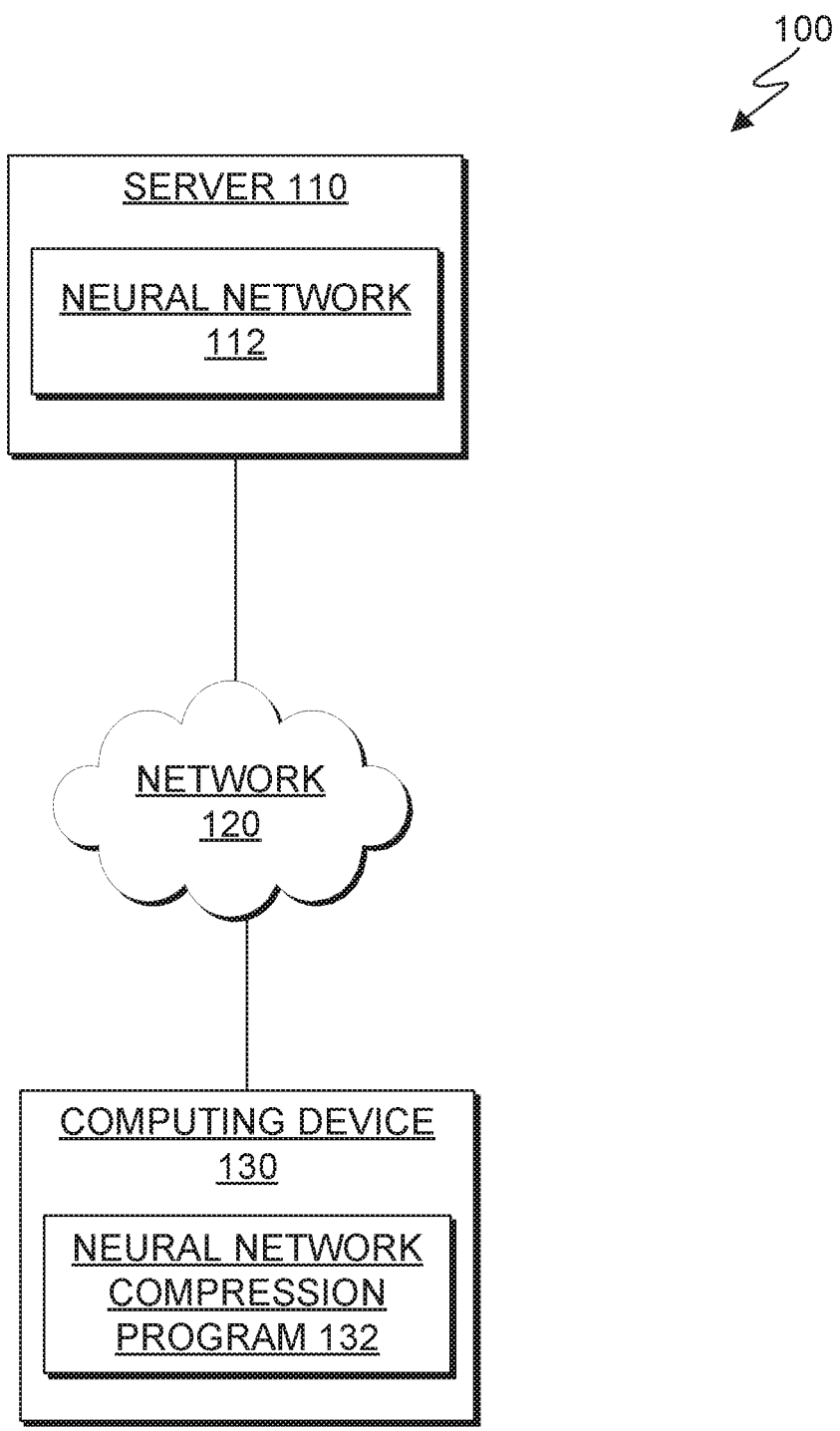
FIG. 1 depicts a block diagram of a neural network computing environment, in accordance with an embodiment of the present invention.

Embodiments of the present invention recognize that deep neural networks (DNNs) can have hundreds of million parameters, e.g., VGGNet with 155 million parameters, which can make it difficult for DNNs to be deployed in practical applications. DNNs can require large amounts of memory storage, large amounts of power consumption, and long inference times. Additionally, DNNs can be heavily over-parameterized and are prone to over-fitting. One of the biggest data sets used to train a DNN, ImageNet, consists of 1.2 million training examples. Thus, embodiments of the present invention recognize the need for a way to compress DNNs so that DNNs can be utilized for practical applications.

Embodiments of the present invention provide a compression method that prunes many connections from a pre-trained DNN while maintaining comparable accuracy. The compression method is based on solving tractable optimization problems for pruning DNNs. More specifically, embodiments of the present invention provide a tractable optimization model to compress a DNN by pruning nodes and weights while giving a high compression rate and maintaining accuracy. This optimization model: (1) automatically prunes redundant connections layer-by-layer in a pre-trained DNN; (2) enforces consistency between resulting response and pre-trained DNN response; (3) uses two separate models for middle layers and last layers; (4) controls the compression rate by L0-norm constraints at each layer; (5) transfers learning for a specialized task from the complete data; and (6) handles all popular neural network architectures, such as recurrent neural networks (RNNs), feedforward neural networks (FNNs), and convolutional neural networks (CNNs).

Embodiments of the present invention provide a reduction in memory storage and power consumption required for the DNN. Additionally, embodiments of the present invention provide a reduction in inference time. These reductions allow DNNs to be used in practical applications including: (1) low-resource environments such as mobile devices, "Internet of Things" edge devices, and "inferencing as a service" environments on cloud systems; (2) real-time prediction; (3) portable devices; and (4) transferred learning for specialized tasks.

Embodiments of the present invention provide a compression program that compresses a pre-trained DNN using an optimization model. Embodiments of the present invention compress the DNN using received training data, neural network data, and a specified compression ratio that enables the compression program to output a compressed DNN within a specific memory requirement. Embodiments of the present invention utilize an optimization model to solve optimization problems that yield sparse weights, which enforces many of the smallest weights in each layer to be zero. A first embodiment of the present invention uses a convex L1-regularized model for each layer of the DNN to yield sparse weights. This first optimization model can be solved using algorithms known in the art. A second embodiment of the present invention uses a nonconvex L0-constrained model for each layer of the DNN. This second optimization model requires more processing to solve than the first optimization model but provides a better compression that yields a higher sparsity—yields more zero locations—than the first optimization model. The algorithm for solving the second optimization model is discussed in more detail in the paragraphs for the second optimization model under step 230 of FIG. 2 below.

For any layer of the DNN with a rectified linear unit (ReLU) for the activation function, a third embodiment of the present invention uses a third optimization model that requires more processing to solve than the first two models but provides a better compression that yields a higher sparsity—yields more zero locations—for these layers. This third optimization model helps to enforce consistency at each layer between the resulting response and the pre-trained response. The third optimization model utilizes a two-step algorithm based on decomposition techniques exploiting the special structure of the third optimization model. The first step of the algorithm decomposes the large-scale problem into a series of master problems and subproblems. The second step of the algorithm solves the master problem by combining an alternating optimization algorithm and variance-reduction stochastic gradient decent algorithm. This two-step algorithm for solving the third optimization model is discussed in more detail in the paragraphs for the third optimization model under step 230 of FIG. 2 below.

The present invention will now be described in detail with reference to the Figures.

FIG. 1 depicts a functional block diagram illustrating neural network computing environment 100, in accordance with an embodiment of the present invention. FIG. 1 provides only an illustration of one embodiment of the present invention and does not imply any limitations with regard to the environments in which different embodiments may be implemented. In the depicted embodiment, neural network computing environment 100 includes server 110 and computing device 130 interconnected over network 120. Network 120 can be, for example, a local area network (LAN), a wide area network (WAN) such as the Internet, or a combination of the two, and can include wired, wireless, or fiber optic connections. In general, network 120 can be any combination of connections and protocols that will support communications between server 110 and computing device 130. Neural network computing environment 100 may include additional servers, computers, or other devices not shown.

Server 110 can run a neural network, such as neural network 112, and store and/or send data, such as neural network data, training data, and/or a compression ratio. In an embodiment, server 110 sends data, such as neural network data, training data, and/or a compression ratio, to computing device 130. In some embodiments, server 110 may be a management server, a web server, or any other electronic device or computing system capable of receiving and sending data. In some embodiments, server 110 may be a laptop computer, tablet computer, netbook computer, personal computer (PC), a desktop computer, a smart phone, or any programmable electronic device capable of communicating with computer device 130 via network 120. In other embodiments, server 110 represents a server computing system utilizing multiple computers as a server system, such as in a cloud computing environment. Server 110 may include components as described in further detail in FIG. 5.

Neural network 112 operates as a neural network that has been trained with a well-tuned set of hyperparameters on a set of training data to complete a specific task, such as image recognition. Once trained, neural network 112 is a very dense neural network or DNN. In an embodiment, components of neural network 112 include, but are not limited to, layers, inputs, weights, nodes, and outputs, such that an input is propagated through neural network 112 moving through each layer with weighted connections until it reaches the output layer. In an embodiment, neural network 112 is sent from server 110 to computing device 130. In other embodiments, neural network compression program 132 receives a neural network from another server or computing device (not shown). In an embodiment, neural network 112 is a pre-trained DNN. In several other embodiments, neural network 112 can be a pre-trained RNN, a pre-trained FNN, or a pre-trained CNN. In the depicted embodiment, neural network 112 resides on server 110. In other embodiments, neural network 112 may reside on computing device 130 or another computing device (not shown), provided that neural network compression program 132 has access to neural network 112.

Computing device 130 operates to run a neural network compression program, such as neural network compression program 132. In an embodiment, computing device 130 can receive data, such as neural network data, training data, and/or a compression ratio, from server 110 and/or from another server (not shown). In some embodiments, computing device 130 may be a management server, a web server, or any other electronic device or computing system capable of receiving and sending data. In some embodiments, computing device 130 may be a laptop computer, tablet computer, netbook computer, personal computer (PC), a desktop computer, a smart phone, or any programmable electronic device capable of communicating with server 110 via network 120. Computing device 130 may include components as described in further detail in FIG. 5.

Neural network compression program 132 operates as a program for compressing a neural network using an optimization model. In an embodiment, neural network compression program 132 receives a neural network, such as neural network 112, that is pre-trained on training data for a specific task. In an embodiment, neural network compression program 132 compresses the neural network, such as neural network 112, using an optimization model to determine sparse weights. In an embodiment, neural network compression program 132 re-trains and fine-tunes the compressed neural network, such as neural network 112. In an embodiment, neural network compression program 132 outputs the final neural network, such as neural network 112. In the depicted embodiment, neural network compression program 132 resides on computing device 130. In other embodiments, neural network compression program 132 may reside on a server, such as server 110, or another computing device (not shown), provided that neural network compression program 132 has access to neural network 112.

Figure 2:
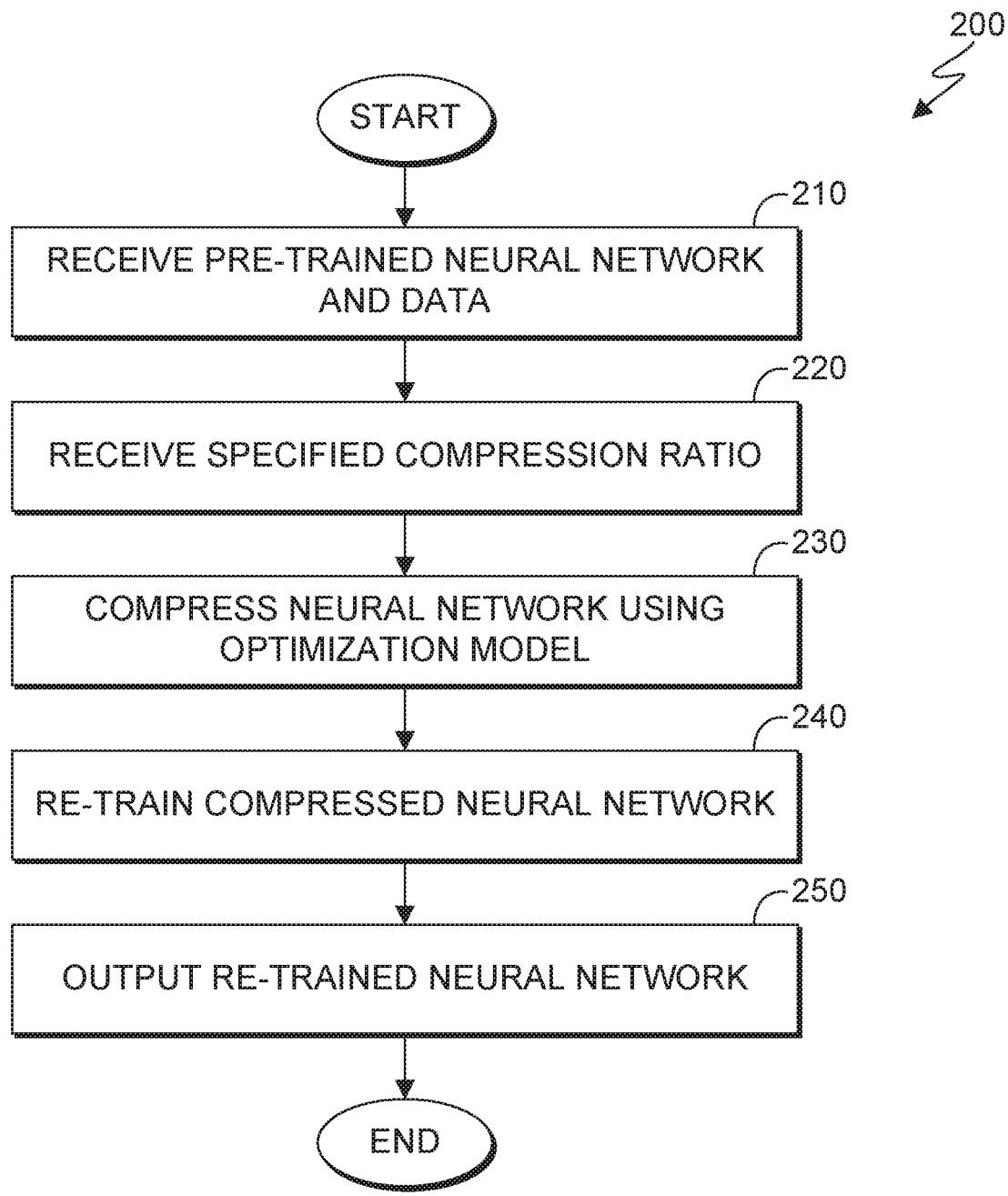
FIG. 2 depicts a flow chart of the steps of a neural network compression program, in accordance with an embodiment of the present invention.

FIG. 2 depicts a flowchart 200 of the steps of neural network compression program 132, in accordance with an embodiment of the present invention. In an embodiment, neural network compression program 132 receives a neural network that is pre-trained, compresses the neural network using an optimization model, re-trains the compressed neural network, and outputs the compressed and re-trained neural network. It should be appreciated that the process depicted in FIG. 2 illustrates one possible iteration of the process flow, which repeats for each pre-trained neural network received by neural network compression program 132.

In step 210, neural network compression program 132 receives a neural network, training data, and neural network data. The neural network may be pre-trained on set of training data for a specific task that yields a very dense neural network. In an embodiment, neural network compression program 132 receives neural network 112 from server 110. In other embodiments, neural network compression program 132 receives a neural network from another server or computing device (not shown). In an embodiment, neural network 112 is a pre-trained DNN. In several embodiments, neural network 112 may be a pre-trained RNN, a pre-trained FNN, or a pre-trained CNN.

In an embodiment, neural network 112 has been pre-trained on training data, which includes, but is not limited to, a set of inputs $\{X=X^0\}$ and a label for each input $\{Y\}$ that created neural network data. Neural network data includes, but is not limited to, layers $\{l=1 \ldots L\}$, an output at each layer for each input $\{X^l=X^1 \ldots X^{L-1}\}$, a final output for each input $\{X^L\}$, and weights at each layer $\{W^1 \ldots W^L\}$. In an embodiment, neural network 112 has been trained to a point in which the difference between the label and the final output, calculated using a mean squared error loss function, $\|Y-X^L\|^2$, is minimized to a pre-defined value or acceptable value known in the art.

In an embodiment, neural network compression program 132 receives training data and neural network data. In an embodiment, neural network compression program 132 receives training data and neural network data from server 110. In other embodiments, neural network compression program 132 receives training data and neural network data from another server or computing device (not shown). In an embodiment, neural network compression program 132 uses the same set of training data for compressing neural network 112. In other embodiments, neural network compression program 132 uses a different set of training data for compressing neural network 112 than was used during pre-training of neural network 112.

In step 220, neural network compression program 132 receives a specified compression ratio. In an embodiment, neural network compression program 132 enables a specified compression ratio to be input using a user interface (not shown) of computing device 130. In another embodiment, neural network compression program 132 receives a specified compression ratio from server 110. In other embodiments, neural network compression program 132 receives a specified compression ratio from another server or computing device (not shown). Compression ratio is defined as a ratio of the number of zero weights over the number of nonzero weights in a resulting compressed neural network. The compression ratio may be based on a memory limit/requirement or amount of memory storage available for running neural network 112 on a specific device. The compression ratio may be based on a desired compression rate to be able to meet that memory limit. For example, if in a resulting compressed neural network, there can only be 5% of the nonzero weights that were in the pre-compressed neural network, then the compression ratio is 95/5 with a goal compression rate of 19.

In step 230, neural network compression program 132 compresses the neural network. In an embodiment, neural network compression program 132 compresses neural network 112 using an optimization model. In an embodiment, neural network compression program 132 utilizes an optimization model to solve optimization problems that yield new sparse weights $\{\hat{W}^1 \ldots \hat{W}^L\}$ at each layer, which yields new outputs at each layer $\{\hat{X}^l=\hat{X}^1 \ldots \hat{X}^{L-1}\}$ and a new final output $\{\hat{X}^L\}$.

In an embodiment, neural network compression program 132 uses a first optimization model for each layer of neural network 112. In this embodiment, neural network compression program 132 compresses neural network 112 by building optimization models between each layer where a weight is involved to get new sparse weights $\{\hat{W}^1 \ldots \hat{W}^L\}$ and a new output of that layer $\{\hat{X}^l\}$, such that the difference between the pre-trained output of a certain layer $\{X^l\}$ and the new output of that layer $\{\hat{X}^l\}$, calculated using a mean squared error loss function, $\|X^l-\hat{X}^l\|^2$, is minimized to a pre-defined value or acceptable value known in the art. Using the first optimization model, neural network compression program 132 determines new sparse weights $\{\hat{W}^1 \ldots \hat{W}^L\}$ and a new final output $\{\hat{X}^L\}$ such that the difference between the pre-trained output $\{X^L\}$ and the new output $\{\hat{X}^L\}$, calculated using a mean squared error loss function, $\|X^L-\hat{X}^L\|^2$, is minimized to a pre-defined value or acceptable value known in the art. In this embodiment, neural network compression program 132 uses a L1-regularized model with a convex objective to solve for the new sparse weights $\{\hat{W}^1 \ldots \hat{W}^L\}$, calculated using model (1) for some positive parameter $\{\alpha>0\}$. In model (1), $\|X^{l-1}\hat{W}-X^l\|$ measures the output deviation between the compressed neural network and the pre-trained neural network at an l-th layer. Neural network compression program 132 can use algorithms known in the art to solve model (1) for the new sparse weights $\{\hat{W}^1 \ldots \hat{W}^L\}$.

$$\min_{\hat{W}} \|X^{l-1}\hat{W} - X^l\|^2 + \alpha\|\hat{W}\|_1 \quad (1)$$

In another embodiment, neural network compression program 132 uses a second optimization model for each layer of neural network 112. In this embodiment, neural network compression program 132 compresses neural network 112 by building optimization models between each layer where a weight is involved to get new sparse weights $\{\hat{W}^1 \ldots \hat{W}^L\}$ and a new output of that layer $\{\hat{X}^l\}$, such that the difference between the pre-trained output of a certain layer $\{X^l\}$ and the new output of that layer $\{\hat{X}^l\}$, calculated using a mean squared error loss function, $\|X^l-\hat{X}^l\|^2$, is minimized to a pre-defined value or acceptable value known in the art. Using the second optimization model, neural network compression program 132 determines new sparse weights $\{\hat{W}^1 \ldots \hat{W}^L\}$ and a new output $\{\hat{X}^L\}$ such that the difference between the pre-trained output $\{X^L\}$ and the new output, calculated using a mean squared error loss function, $\|X^L-\hat{X}^L\|^2$, is minimized to a pre-defined value or acceptable value known in the art. In this embodiment, neural network compression program 132 uses a non-convex L0-constrained model with a convex objective to solve for the new sparse weights $\{\hat{W}^1 \ldots \hat{W}^L\}$, calculated using model (2) for a maximally allowable number of nonzeros $\{\kappa\}$ in the compressed neural network, which neural network compression program 132 determines based on the specified compression ratio received in step 220.

$$\min_{\hat{W}} \|X^{l-1}\hat{W} - X^l\|^2 \quad (2)$$
$$\text{s.t. } \|\hat{W}\|_0 \le \kappa$$

In an embodiment, neural network compression program 132 rewrites model (2) in form (2a) for some vectors $\{a_i, b_i\}$, scalars $\{y_i\}$, and parameters obtained from model (2). The optimal solution of form (2a) is used as the sparse weight $\hat{W}$ for model (2).

$$\min_{w \in \mathbb{R}^{m_l}, \|w\|_0 \le \kappa} \phi(w) = \frac{1}{n}\sum_{i=1}^{n} f_i(w) = \sum_{i=1}^{n}\left((a_i^T w - y_i)^2 + b_i^T w\right) \quad (2a)$$

In an embodiment, neural network compression program 132 solves form (2a) using the algorithm depicted in FIG. 3, variance-reduction stochastic gradient descent. At each iteration, a sample point is randomly picked, the gradient for the associated loss function is computed, and the decision variable is updated. For each update, the gradient step is projected into the sparsity constraint. After a certain number of inner iterations, a full gradient is calculated to reduce the gradient variance.

In yet another embodiment, neural network compression program 132 uses a third optimization model for each layer of neural network 112 that uses an ReLU as an activation function. This third optimization model imposes consistency at each layer between the resulting response and the pre-trained response. In this embodiment, neural network compression program 132 compresses neural network 112 by building optimization models between each layer where a weight is involved to get new sparse weights $\{\hat{W}^1 \ldots \hat{W}^L\}$ and a new output of that layer $\{\hat{X}^l\}$, such that the difference between the pre-trained output of a certain layer $\{X^l\}$ and the new output of that layer $\{\hat{X}^l\}$, calculated using a mean squared error loss function, $\|X^l - \hat{X}^l\|^2$, is minimized to a pre-defined value or acceptable value known in the art. Using the third optimization model, neural network compression program 132 determines new sparse weights $\{\hat{W}^1 \ldots \hat{W}^L\}$ and a new output $\{\hat{X}^L\}$ such that the difference between the pre-trained output $\{X^L\}$ and the new output, calculated using a mean squared error loss function, $\|X^L - \hat{X}^L\|^2$, is minimized to a pre-defined value or acceptable value known in the art. In this embodiment, neural network compression program 132 solves for new sparse weights $\{\hat{W}^1 \ldots \hat{W}^L\}$, calculated using model (3) in which the objective function is the sum of the mean squared loss and the amount of entries changing from negative to positive values measured by variable $y_{i,j}$, and $\rho$ is a hyperparameter.

$$\min_{W,y} F(W, y) = \frac{0.5}{|\overline{\Omega}|}\left\|\left(X^{l-1}W - X^l\right)_{(i,j)\in\overline{\Omega}}\right\|_F^2 + \frac{\rho}{|\Omega|}\Sigma_{(i,j)\in\Omega} y_{i,j} \quad (3)$$

s.t. $\left(X_i^{l-1}\right)^T W_j \leq y_{i,j}, \forall (i,j) \in \Omega$ $y_{i,j} \geq 0, \forall (i,j) \in \Omega$ $\|W\|_0 \leq \kappa$ $\overline{\Omega} = \{(i,j):X_{i,j}^l > 0\}, \Omega = \{(i,j):X_{i,j}^l = 0\}$ In an embodiment, neural network compression program 132 solves model (3) iteratively by predicting the entries $y_{i,j}$ to be positive and then adding them to the model. In an embodiment, neural network compression program 132 determines the newly added entries by the optimal conditions. In an embodiment, neural network compression program 132 uses a series of steps for solving third optimization model (3). In an initial step for solving model (3), neural network compression program 132 defines that LB=−∞, UB=∞, P=∅, and C=∅. In a first step for solving model (3), neural network compression program 132 solves subproblem (3a) for $\overline{W}$ and $\overline{z}$, then computes $\overline{z}_{i,j}$ using equation (3b) for every (i,j) ∈ Ω, and then updates LB=obj. Neural network compression program 132 solves a sequence of models of subproblem (3a) to obtain a solution, $\overline{W}$, that is used as the sparse weight $\hat{W}$.

$$obj = \min_{W,z} \frac{0.5}{|\overline{\Omega}|}\left\|\left(X^{(l-1)}W - X^l\right)_{(i,j)\in\overline{\Omega}}\right\|_F^2 + \quad (3a)$$
$$\frac{\rho}{|\Omega|}\Sigma_{(i,j)\in C} z_{i,j} + \frac{\rho}{|\Omega|}\Sigma_{(i,j)\in P}\left(X_i^{l-1}\right)^T W_j$$

-continued s.t. $\left(X_i^{(l-1)}\right)^T W_j \leq z_{i,j}, \forall (i,j) \in C$ $-\left(X_i^{(l-1)}\right)^T W_j \leq z_{i,j}, \forall (i,j) \in C$ $z_{i,j} \geq 0, \forall (i,j) \in C$ $\|W\|_0 \leq \kappa$ $$\overline{z}_{i,j} = \begin{cases} \left(X_i^{(l-1)}\right)^T \overline{W}_j, & \text{if } (i,j) \in P \\ z_{i,j}, & \text{if } (i,j) \in C \\ 0, & \text{if } (i,j) \in \Omega\setminus(P \cup C) \end{cases} \quad (3b)$$

In a second step for solving model (3), for every (i,j) ∈ Ω, neural network compression program 132 computes q and $\overline{y}$ following equation (3c).

If $(X_i^{(l-1)})^T \overline{W}_j > 0$, then $q_{i,j} = (X_i^{(l-1)})^T \overline{W}_j, \overline{y}_{i,j} = (X_i^{(l-1)})^T \overline{W}_j$ otherwise $q_{i,j} = 0, \overline{y}_{i,j} = 0$ \quad (3c)

In a third step for solving model (3), if $q_{i,j} \leq \overline{z}_{i,j}$ for all (i,j), then neural network compression program 132 returns ($\overline{W}$, $\overline{y}$) as an optimal solution and ends the process. In a fourth step for solving model (3), if $F(\overline{W},\overline{y})<UB$, then $F(\overline{W},\overline{y})=UB$. In a fifth step for solving model (3), if UB−LB≤ϵ, then neural network compression program 132 ends the process. In a sixth step for solving model (3), for every (i,j) ∈ Ω, if $q_{ij} > \overline{z}_{i,j}$, then neural network compression program 132 follows equation (3d). Neural network compression program 132 iterates these series of steps until a stopping criterion is satisfied. For example, if UB−LB≤$10^{-5}$, neural network compression program 132 terminates the process.

If $(X_i^{(l-1)})^T \overline{W}_j > 0$, then $P = \cup (i,j)$

Otherwise $C = C \cup (i,j)$ \quad (3d)

In an embodiment, neural network compression program 132 solves subproblem (3a) from the first step for solving model (3) using a decomposition algorithm or alternating direction method of multipliers and reformulates to form (3e).

$$\min_{W,z,u,v} \frac{0.5}{|\overline{\Omega}|}\left\|\left(X^{(l-1)}W - X^{(l)}\right)_{(i,j)\in\overline{\Omega}}\right\|_F^2 + \quad (3e)$$
$$\frac{\rho}{|\Omega|}\Sigma_{(i,j)\in C} z_{i,j} + \frac{\rho}{|\Omega|}\Sigma_{(i,j)\in P}\left(x_i^{(l-1)}\right)^T W_j$$

s.t. $\left(X_i^{(l-1)}\right)^T W_j - z_{i,j} + u_{i,j} = 0, \forall (i,j) \in C$ $-\left(X_i^{(l-1)}\right)^T W_j - z_{i,j} + v_{i,j} = 0, \forall (i,j) \in C$ $z_{i,j} \geq 0, u_{i,j} \geq 0, v_{i,j} \geq 0 \forall (i,j) \in C$ $\|W\|_0 \leq \kappa$ In an embodiment, neural network compression program 132 rewrites form (3e) as an augmented Lagrangian function (3f).

$$\mathcal{L}(W, z, u, v, \lambda, \gamma) = \quad (3f)$$
$$\frac{0.5}{|\overline{\Omega}|}\left\|\left(X^{l-1}W - X^{(l)}\right)_{(i,j)\in\overline{\Omega}}\right\|_F^2 + \frac{\rho}{|\Omega|}\sum_{(i,j)\in C} z_{i,j} + \frac{\rho}{|\Omega|}\sum_{(i,j)\in P}\left(X_i^{l-1}\right)^T W_j +$$
$$\sum_{(i,j)\in C}\left(\lambda_{i,j}\left(\left(X_i^{l-1}\right)^T W_j - z_{i,j} + u_{i,j}\right) + \gamma_{i,j}\left(-\left(X_i^{l-1}\right)^T W_j - z_{i,j} + v_{i,j}\right)\right)$$

-continued $$+\frac{\beta}{2}\sum_{(i,j)\in C}\left(\left(\left(X_i^{l-1}\right)^T W_j - z_{i,j} + u_{i,j}\right)^2 + \left(-\left(X_i^{l-1}\right)^T W_j - z_{i,j} + v_{i,j}\right)^2\right)$$

In an embodiment, neural network compression program 132 solves subproblem (3a) by penalizing the coupling linear constraint and alternatively minimizing the augmented Lagrangian function (3f) using a series of steps. In an initial step for solving subproblem (3a), neural network compression program 132 sets k=0,β>0, and $z^0$, $u^0$, $v^0$, $\lambda^0$, $\gamma^0$ as starting points. In a first step for solving subproblem (3a), neural network compression program 132 solves subproblem (3g) for W.

$$W^{k+1} = \operatorname{argmin}_{W:\|W\|_0 \leq \kappa} \frac{0.5}{|\Omega|} \left\| \left(X^{l-1}W - X^{(l)}\right)_{(i,j)\in\overline{\Omega}} \right\|_F^2 + \tag{3g}$$

$$\frac{\rho}{|\Omega|} \sum_{(i,j)\in P} \left(X_i^{l-1}\right)^T W_j + \sum_{(i,j)\in C} \left(\lambda_{i,j}\left(X_i^{l-1}\right)^T W_j - \gamma_{i,j}\left(X_i^{l-1}\right)^T W_j\right) +$$

$$\frac{\beta}{2} \sum_{(i,j)\in C} \left(\left(\left(X_i^{l-1}\right)^T W_j - z_{i,j}^k + u_{i,j}^k\right)^2 + \left(-\left(X_i^{l-1}\right)^T W_j - z_{i,j}^k + v_{i,j}^k\right)^2\right)$$

In a second step for solving subproblem (3a), neural network compression program 132 solves subproblem (3h) for z, u, and v.

$$\left(z_{i,j}^{k+1}, u_{i,j}^{k+1}, v_{i,j}^{k+1}\right) = \operatorname{argmin}_{z,u,v} \frac{\rho}{|\Omega|} z_{i,j} - \lambda_{i,j}^k(z_{i,j} - u_{i,j}) - \gamma_{i,j}^k(z_{i,j} - v_{i,j}) + \tag{3h}$$

$$\frac{\beta}{2}\left(\left(\left(X_i^{l-1}\right)^T W_j^{k+1} - z_{i,j} + u_{i,j}\right)^2 + \left(-\left(X_i^{l-1}\right)^T W_j^{k+1} - z_{i,j} + v_{i,j}\right)^2\right)$$

In a third step for solving subproblem (3a), neural network compression program 132 updates λ and γ using subproblem (3i).

$$\lambda_{i,j}^{k+1} = \lambda_{i,j}^{k} + \beta((X_i^{(l-1)})^T W_j^{k+1} - z_{i,j}^{k+1} + u_{i,j}^{k+1})$$

$$\gamma_{i,j}^{k+1} = \gamma_{i,j}^{k} + \beta(-(X_i^{(l-1)})^T W_j^{k+1} - z_{i,j}^{k+1} + v_{i,j}^{k+1}) \tag{3i}$$

In a fourth step for solving subproblem (3a), neural network compression program 132 sets k=k+1. Neural network compression program 132 repeats the steps for solving subproblem (3a) until a stopping criterion is satisfied, for example, if $\|W^{k+1}-W^k\|\leq 10^{-5}$, neural network compression program 132 terminates the process.

In an embodiment, to solve subproblem (3g), neural network compression program 132 rewrites subproblem (3g) in form (3j) for some vectors $\{a_i,b_i\}$, scalars $\{y_i\}$, and parameters obtained from subproblem (3g). In an embodiment, neural network compression program 132 solves form (3j) using the algorithm depicted in FIG. 3.

$$\min_{w\in\mathbb{R}^m, \|w\|_0 \leq \kappa} \phi(w) = \frac{1}{n}\sum_{i=1}^n f_i(w) = \sum_{i=1}^n \left(\left(a_i^T w - y_i\right)^2 + b_i^T w\right) \tag{3j}$$

In an embodiment, neural network compression program 132 compresses an FNN. In another embodiment, neural network compression program 132 compresses a CNN. For a CNN, neural network compression program 132 vectorizes the input and determines matrices sparse weights. In an embodiment in which neural network 112 is an FNN or a CNN, neural network compression program 132 can utilize the first optimization model, second optimization model, or third optimization model to yield the sparse weights.

In yet another embodiment, neural network compression program 132 compresses an RNN. Neural network compression program 132 recursively calculates the hidden layers using equation (5) where U* and V* are parameters of the trained network and σ is an activation function.

$$h_t^\sigma = \sigma(U^* x_t + V^* h_{t-1}^\sigma) = \sigma\left([U^* V^*]\begin{bmatrix}x_t \\ h_{t-1}^\sigma\end{bmatrix}\right) := \sigma(Az_t) \tag{5}$$

$$h_t = U^* x_t + V^* h_{t-1}^\sigma + A^* z_t$$

$$h_t^\sigma = \sigma(h_t)$$

In an embodiment, neural network compression program 132 compresses the RNN by solving optimization problem (5a) where N is the number of samples, L is the number of nodes in each layer. In an embodiment, neural network compression program 132 solves optimization problem (5a) using the algorithm depicted in FIG. 3 to get sparse matrix weights U* and V*.

$$(\hat{U}, \hat{V}) = \operatorname{argmin}_A \frac{1}{NL}\sum_{i=1}^N \sum_{t=1}^L \|h_t(i) - Az_t(i)\|_2^2 \text{ s.t. } \|A\|_0 \leq \kappa \tag{5a}$$

In step 240, neural network compression program 132 re-trains and fine-tunes the neural network. In an embodiment, neural network compression program 132 re-trains and fine-tunes neural network 112 with the new sparse weights $\{\hat{W}^1 \ldots \hat{W}^L\}$ between each layer such that the difference between the label {Y} and the new output $\{\hat{X}^L\}$, calculated using a mean squared error loss function, $\|Y-\hat{X}^l\|^2$, is minimized to a pre-defined value or acceptable value known in the art.

In step 250, neural network compression program 132 outputs the neural network. In an embodiment, neural network compression program 132 outputs neural network 112 that is now compressed and re-trained. In an embodiment, neural network compression program 132 sends neural network 112 and new neural network data to server 110 or another server (not shown).

FIG. 4 depicts a chart 400 of experimental results of a neural network compression program, in accordance with an embodiment of the present invention utilizing the second optimization model. Chart 400 shows compression rates achieved for three different neural networks using known methods and an embodiment of the invention herein using the second optimization model. In this chart, compression rate is defined as a ratio of the number of nonzero weights in an original neural network over the number of nonzero weights in a resulting compressed neural network.

Figure 5:
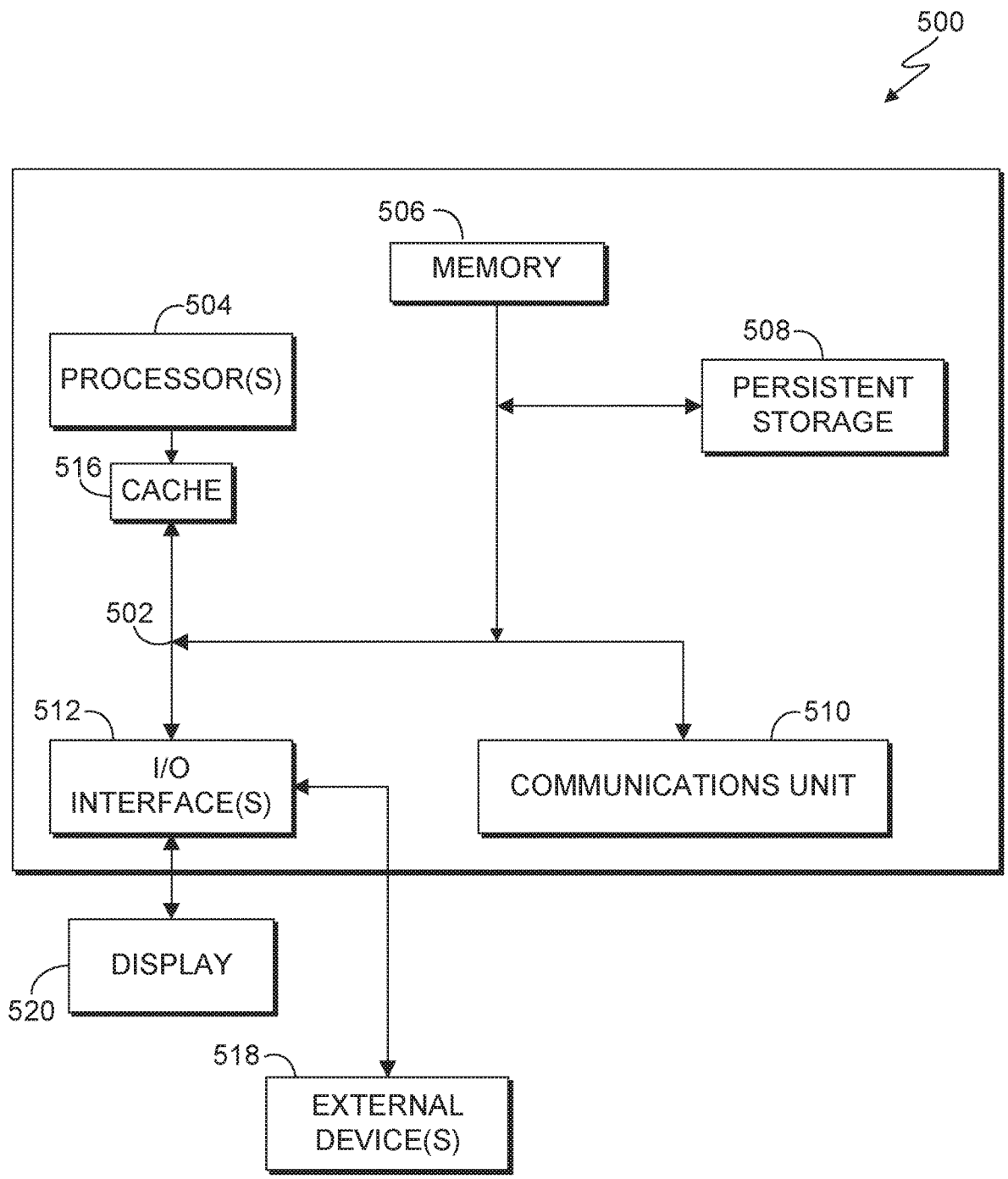
FIG. 5 depicts a block diagram of a computing device of neural network computing environment, in accordance with an embodiment of the present invention.

FIG. 5 depicts a block diagram of computer 500 suitable for server 110 and computing device 130, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computer 500 includes communications fabric 502, which provides communications between cache 516, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses or a crossbar switch.

Memory 506 and persistent storage 508 are computer readable storage media. In this embodiment, memory 506 includes random access memory (RAM). In general, memory 506 can include any suitable volatile or non-volatile computer readable storage media. Cache 516 is a fast memory that enhances the performance of computer processor(s) 504 by holding recently accessed data, and data near accessed data, from memory 506.

Neural network compression program 132 may be stored in persistent storage 508 and in memory 506 for execution and/or access by one or more of the respective computer processors 504 via cache 516. In an embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Programs, such as neural network compression program 132, may be downloaded to persistent storage 508 through communications unit 510.

I/O interface(s) 512 allows for input and output of data with other devices that may be connected to computing device 130 and server 110. For example, I/O interface 512 may provide a connection to external devices 518 such as a keyboard, keypad, a touch screen, and/or some other suitable input device. External devices 518 can also include portable computer readable storage media such as, for example, thumb drives, portable optical or magnetic disks, and memory cards. Software and data used to practice embodiments of the present invention can be stored on such portable computer readable storage media and can be loaded onto persistent storage 508 via I/O interface(s) 512. I/O interface(s) 512 also connect to a display 520.

Display 520 provides a mechanism to display data to a user and may be, for example, a computer monitor.

Neural network compression program 132 described herein is identified based upon the application for which it is implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for compressing neural networks, executed by one or more processors, the method comprising:
   receiving a neural network, wherein the neural network has been trained on a set of training data;
   receiving a compression ratio; compressing the neural network layer-by-layer based on the compression ratio using an optimization model imposed at each layer of the neural network to solve fora set of sparse weights, wherein the optimization model is a two-step algorithm that decomposes a problem into a series of a master problem and subproblems and then solves the master problem by combining an alternating optimization algorithm and variance-reduction stochastic gradient decent algorithm to solve for the set of sparse weights for a maximally allowable number of nonzeros and wherein the set of sparse weights includes more zero values than an original set of weights for the neural network;
   re-training the compressed neural network with the set of sparse weights; and
   outputting the re-trained neural network.

2. The method of claim 1, wherein the compression ratio is a ratio of zero weights to nonzero weights that is based on an amount of memory storage available for running the re-trained neural network on a computing device.

3. The method of claim 2, wherein the computing device is a mobile device.

4. The method of claim 1, wherein the optimization model is $$\min_{\hat{W}} \left\| X^{l-1} \hat{W} - X^l \right\|^2$$

subject to $\|\hat{W}\|_0 \leq \kappa$, wherein:
   $\hat{W}$ is a sparse weight,
   $X^{l-1}$ is an output of a first layer,
   $X^l$ is an output of a second layer that is subsequent to the first layer, and
   $\kappa$ is a maximally allowable number of nonzero weights based on the compression ratio.

5. The method of claim 1, wherein re-training the compressed neural network with the sparse weights comprises minimizing to a pre-defined value an average squared difference between a label for an input of the neural network and final output of the neural network based on the set of sparse weights.

6. A computer program product for compressing a neural network, the computer program product comprising:
   one or more computer readable storage media and program instructions stored on the one or more computer readable storage media, wherein the one or more computer readable storage media is not a transitory signal per se, the program instructions comprising:
   program instructions to receive a neural network, wherein the neural network has been trained on a set of training data; program instructions to receive a compression ratio;
   program instructions to compress the neural network layer-by-layer based on the compression ratio using an optimization model imposed at each layer of the neural network to solve fora set of sparse weights, wherein the optimization model is a two-step algorithm that decomposes a problem into a series of a master problem and subproblems and then solves the master problem by combining an alternating optimization algorithm and variance-reduction stochastic gradient descent algorithm to solve for the set of sparse weights for a maximally allowable number of nonzeros and wherein the set of sparse weights includes more zero values than an original set of weights for the neural network;
program instructions to re-train the compressed neural network with the set of sparse weights; and
program instructions to output the re-trained neural network.

7. The computer program product of claim 6, wherein the compression ratio is a ratio of zero weights to nonzero weights that is based on an amount of memory storage available for running the re-trained neural network on a computing device.

8. The computer program product of claim 6, wherein the computing device is a mobile device.

9. The computer program product of claim 6, wherein the optimization model is $$\min_{\hat{W}} \|X^{l-1}\hat{W} - X^l\|^2 \text{ subject to } \|\hat{W}\|_0 \leq \kappa,$$

wherein:
$\hat{W}$ is a sparse weight,
$X^{l-1}$ is an output of a first layer,
$X^l$ is an output of a second layer that is subsequent to the first layer, and
$\kappa$ is a maximally allowable number of nonzero weights based on the compression ratio.

10. The computer program product of claim 6, wherein the program instructions to re-train the compressed neural network with the sparse weights comprises program instructions to minimize to a pre-defined value an average squared difference between a label for an input of the neural network and final output of the neural network based on the set of sparse weights.

11. A computer system for compressing a neural network, the computer system comprising:
one or more computer processors;
one or more computer readable storage media, wherein the one or more computer readable storage media is not a transitory signal per se;
program instructions stored on the computer readable storage media for execution by at least one of the one or more processors, the program instructions comprising:
program instructions to receive a neural network, wherein the neural network has been trained on a set of training data;
program instructions to receive a compression ratio;
program instructions to compress the neural network layer-by-layer based on the compression ratio using an optimization model imposed at each layer of the neural network to solve for a set of sparse weights, wherein the optimization model is a two-step algorithm that decomposes a problem into a series of a master problem and subproblems and then solves the master problem by combining an alternating optimization algorithm and variance-reduction stochastic gradient descent algorithm to solve for the set of sparse weights for a maximally allowable number of nonzeros and wherein the set of sparse weights includes more zero values than an original set of weights for the neural network;
program instructions to re-train the compressed neural network with the set of sparse weights; and program instructions to output the re-trained neural network.

12. The computer system of claim 11, wherein the compression ratio is a ratio of zero weights to nonzero weights that is based on an amount of memory storage available for running the re-trained neural network on a computing device.

13. The computer system of claim 12, wherein the computing device is a mobile device.

14. The computer system of claim 11, wherein the optimization model is $$\min_{\hat{W}} \|X^{l-1}\hat{W} - X^l\|^2 \text{ subject to } \|\hat{W}\|_0 \leq \kappa,$$

wherein:
$\hat{W}$ is a sparse weight,
$X^{l-1}$ is an output of a first layer,
$X^l$ is an output of a second layer that is subsequent to the first layer, and
$\kappa$ is a maximally allowable number of nonzero weights based on the compression ratio.

* * * * *